United States Patent
Zydek et al.

[11] Patent Number: 5,835,041
[45] Date of Patent: Nov. 10, 1998

[54] CIRCUIT FOR CONDITIONING AND DIGITIZING AN ANALOG SIGNAL

[75] Inventors: Michael Zydek, Langgoöns; Wolfgang Fey, Niedernhausen; Adrian Traskov, Steinbach, all of Germany

[73] Assignee: ITT Automotive Europe GmbH, Frankfurt am Main, Germany

[21] Appl. No.: 714,112

[22] PCT Filed: Mar. 4, 1995

[86] PCT No.: PCT/EP95/00805

§ 371 Date: Jan. 9, 1997

§ 102(e) Date: Jan. 9, 1997

[87] PCT Pub. No.: WO95/26079

PCT Pub. Date: Sep. 28, 1995

[30] Foreign Application Priority Data

Mar. 22, 1994 [DE] Germany ............ 44 09 708.5

[51] Int. Cl.⁶ .................................................. H03M 3/02
[52] U.S. Cl. ................................. 341/143; 341/77
[58] Field of Search ................................. 341/76, 77, 143; 375/247

[56] References Cited

U.S. PATENT DOCUMENTS

| | | | |
|---|---|---|---|
| 3,795,900 | 3/1974 | Monford, Jr. ............. | 341/76 |
| 4,567,883 | 2/1986 | Langer et al. ............ | 128/696 |
| 4,764,685 | 8/1988 | Bleckmann et al. ...... | 307/106 |
| 4,990,914 | 2/1991 | Giancarlo ................. | 341/143 |
| 5,027,120 | 6/1991 | Thurston .................. | 341/143 |
| 5,055,843 | 10/1991 | Ferguson, Jr. et al. .. | 341/143 |
| 5,068,659 | 11/1991 | Sakaguchi ................ | 341/143 |
| 5,159,341 | 10/1992 | McCartney et al. ..... | 341/143 |
| 5,208,595 | 5/1993 | Engel et al. .............. | 341/143 |
| 5,274,326 | 12/1993 | Bleckmann et al. ..... | 324/166 |
| 5,451,867 | 9/1995 | Loreck et al. ........... | 324/166 |

FOREIGN PATENT DOCUMENTS

| | | |
|---|---|---|
| 0 328 318 | 8/1989 | European Pat. Off. . |
| 0 408 287 | 1/1991 | European Pat. Off. . |
| 2 532 445 | 3/1984 | France . |
| 3 543 058 | 6/1987 | Germany . |
| 3 908 314 | 9/1989 | Germany . |
| 283 247 | 10/1990 | Germany . |
| 3 926 617 | 2/1991 | Germany . |
| 3 936 831 | 5/1991 | Germany . |
| 4 019 886 | 9/1991 | Germany . |
| 4 033 740 | 4/1992 | Germany . |
| 4 103 138 | 8/1992 | Germany . |
| 4 203 879 | 8/1992 | Germany . |
| 4 201 675 | 5/1993 | Germany . |
| 4 204 162 | 7/1992 | Japan . |
| 91/06457 | 5/1991 | WIPO . |

OTHER PUBLICATIONS

Byrne, Mike; McCartney, Damien: Kleinste Signale—präzise gemessen, *Elektronik* Apr. 1992, pp. 44–53.

Patni, C.K; Dargle, A.: Innovative Single–Axis Digital––Control Servo Systems for Brush and Brushless DC Permanent Magnetic Motors, *Proceedings of the European Conference on Power Electronics and Applications*, Oct., 1989, pp. 251–256.

*Primary Examiner*—Marc S. Hoff
*Attorney, Agent, or Firm*—Ratner & Prestia

[57] ABSTRACT

A circuit for conditioning and digitizing an analog input signal that includes a control circuit taking the form of a delta modulator that has a comparator, a clock-controlled flip-flop, a digital accumulator and a digital-to-analog converter. The comparator compares the analog input signal with an adapted signal. The comparator output is conducted to the flip-flop which produces a binary data stream representative of the difference between the comparator inputs. The digital output signal is generated by the accumulator which if fed with an integration constant that is a function of the output signal of the flip-flop. The digital output signal of the accumulator is converted into a square wave signal, which corresponds to the analog input signal, by way of a digital low-pass filter and a threshold value comparator to which the mean value of the digital output signal is supplied as a threshold value.

16 Claims, 2 Drawing Sheets

CIRCUIT FOR CONDITIONING AND DIGITIZING AN ANALOG SIGNAL

This application is the U.S. national-phase application of PCT International Application No. PCT/EP95/00805.

BACKGROUND OF THE INVENTION

The present invention relates to a circuit for conditioning and digitizing an analog signal and includes a trigger circuit which processes the analog signal by way of a variable hysteresis which adapts to the signal to be conditioned. The present invention also relates to a circuit for signal conditioning and digitizing.

DE 39 36 831 A1 discloses a circuit for conditioning the analog output signal of a rotational speed sensor which includes a trigger circuit with controllable change-over points or "hysteresis". The coupling factor is determined and multiplied by the frequency of the sensor signal that corresponds to the rotational speed to produce the amplitude of the sensor output signal. The hysteresis of the trigger circuit is then varied as a function of the coupling factor or adapted to the coupling factor. The hysteresis increases with a high coupling factor and decreases with a low coupling factor. The precise calculation of coupling factors in the initial period of a rotation and at rising rotation angular velocity adds to the cost of the circuit.

For example, circuits of this type are required for evaluating the wheel sensor signals which furnish the data needed for control in vehicles having brake systems with anti-lock control or traction slip control. In conventional passive transducers or wheel sensors, the measuring signal is greatly dependent on the wheel speed and the air slot between the transducer and the toothed disc which rotates with the wheel and produces the signals in the transducer by induction. Especially at a low rotational speed and with unfavorable manufacturing tolerances, for example, when a large air slot exists due to tolerances, there is the risk that the useful signal is difficult to distinguish from inevitable spurious signals. Therefore, additional effort is expended during manufacture and assembly to improve manufacturing tolerances.

SUMMARY OF THE INVENTION

An object of the present invention is to improve the interference protection during acquisition of the analog signals, such as acquisition of the previously described measuring signals by way of wheel sensors, and to reduce the expenditure for circuitry, particularly for analog signal processing circuitry. The output signal of the circuit to be configured should be compatible with the present methods and circuits for signal processing and signal evaluation.

This object can be achieved by a circuit of the previously mentioned type which involves, in particular, a control circuit taking the form of a delta modulator that has a comparator which compares the analog signal to be conditioned (which is the reference input of the control circuit) with an adapted signal. The comparator produces a binary signal representative of the signal variation and conducts it to a clock-controlled bistable flip-flop. The output signal of the bistable flip-flop is a binary data stream representative of the difference between the signal to be conditioned and the adapted signal. The data stream is integrated in a digital accumulator and, by way of a digital-to-analog converter, is conducted as an adapted signal to the second input of the comparator. The integration time constant, or the numerical value that is respectively added in the accumulator in the integration cycle, is variable as a function of the output signal of the flip-flop. The digital output signal of the accumulator is evaluated by a digital threshold value comparator which compares the digital output signal, in consideration of the sign, with the mean value of the quantity of the digital output signal, to produce a conditioned square wave signal corresponding to the analog input signal.

According to the present invention, the analog input signal is processed using principles and methods of digital signal processing. By employing a control circuit known as delta modulator, a digital signal is produced which is then evaluated by means of a threshold value comparator furnished with a mean value (as a threshold value) that is produced by integration, i.e. the mean value of the rectified digital signal. Finally, a square wave signal is produced which represents the frequency or the zero passages of the conditioned analog input signal. The square wave signal may then be processed further in a conventional fashion, for example, by an evaluating circuit of an ABS controller. The entire circuit has a simple design, has low manufacturing costs, and provides reliable distinction between spurious signals and useful signals.

A hysteresis which adapts to the analog input signal is achieved by change-over of the threshold value comparator responsive to the threshold values. The change-over takes place when the digital output signal exceeds the mean value of the digital output signal produced in the digital integrator. As soon as the output signal exceeds the mean value, the threshold value comparator will be "set" or "reset", depending on the sign of the output signal, thereby causing a signal change at the output of the threshold value comparator.

The mean value of the output signal, which serves as a threshold value of the threshold value comparator, is produced by a digital integrator.

According to a preferred embodiment of the present invention, the digital output signal is fed to the threshold value comparator and the mean value generator by way of a digital low-pass filter.

According to another preferred embodiment of the present invention, an edge detector is provided to determine the number of successive, equivalent, binary output signals of the flip-flop. A second accumulator connected downstream of the edge detector outputs the numerical value to adapt the integration constant of the first accumulator. Preferably, the numerical value ranges between 1 and 15 depending on the number of successive, equivalent, binary output signals of the flip-flop. This numerical value, which is determined by the second accumulator, is added to or subtracted from the contents of the first accumulator in the working cycle.

This comparatively simple circuit permits converting an analog signal into a digital signal which can be processed further. A circuit of this type with great dynamics is achieved by the edge detector in conjunction with the second accumulator connected downstream of the edge detector.

The digital output signal of the first accumulator is the conditioned and digitized signal which corresponds to the analog input signal.

In the previously mentioned circuit variant, the mean value of the digital output signal serves as a threshold value of the threshold value comparator. When the digital output signal is positive and its absolute value is in excess of the mean value, the threshold value comparator will be set. When the digital output signal is negative and its absolute value is in excess of the mean value, the threshold value comparator will be reset. As long as the digital output signal is lower than the mean value, irrespective of the sign, the output signal of the comparator will not be modified.

Further features, advantages and possible applications of the present invention will become apparent from the following description taken with reference to the accompanying drawings.

DETAILED DESCRIPTION OF THE INVENTION

Figure 1:
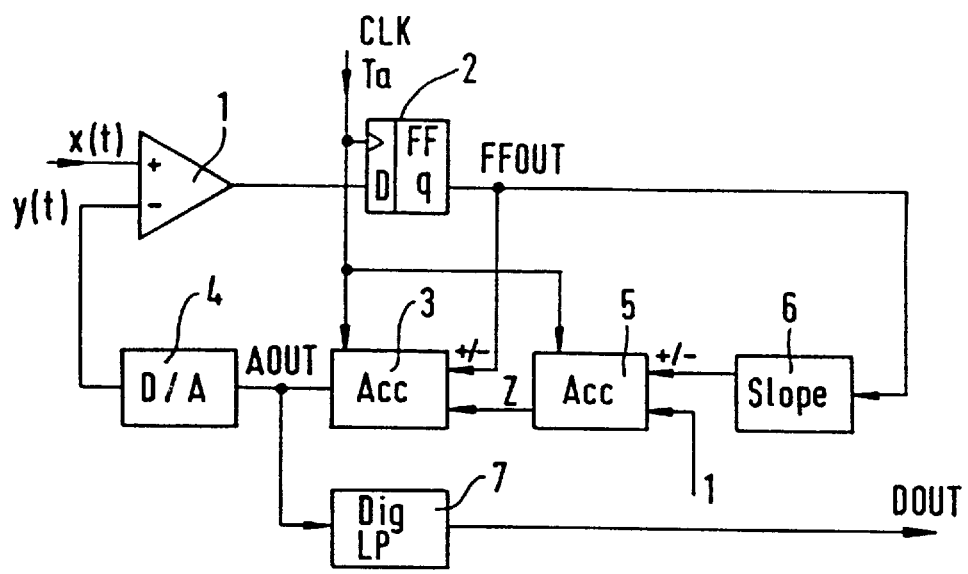
FIG. 1 is a block diagram of a first embodiment of a circuit of the present invention.

In FIG. 1, the circuit of the present invention substantially includes a comparator 1, a clock-controlled bistable flip-flop 2, a first accumulator 3, a digital-to-analog converter 4, an edge detector 6, and a second accumulator 5. The analog input signal x(t) is applied to any one of the two inputs of the comparator 1. The comparator 1, the flip-flop 2, the first accumulator 3 and the digital-to-analog converter 4 form a control circuit in the form of a delta modulator. The signal, x(t) is the input to the control circuit. The signal, y(t), which is applied to the second input of the comparator 1, is the adapted signal. The working cycle for the clock-controlled flip-flop 2 and the first and second digital accumulators 3 and 5 is conducted to the control circuit by way of the terminal CLK. The digital output signal of the circuit prevails at the output of the first accumulator 3, and is conducted for evaluation by way of a digital low-pass filter 7.

The adapted signal y(t) is produced from the output signal of the accumulator 3 by the digital-to-analog converter 4. The output signal of the comparator 1, which constantly compares the analog input signal x(t) with the adapted signal y(t), is a binary signal. The level of the binary signal depends only on the sign of the difference between the analog input signal x(t) and the adapted signal y(t). The clocked flip-flop 2 produces a serial 1-bit data stream which is digitally integrated in the first accumulator 3. The integration time constant of the accumulator 3 depends on the numerical value Z which is added or subtracted in the working cycle of the CLK signal. The value Z is determined by the edge detector 6 and the second accumulator 5. The edge detector 6 ascertains the number of the successive "equivalent" output signals of the flip-flop 2. This value includes information about the edge steepness of the analog input signal x(t). The output signals of the edge detector 6 are digitally integrated in the second accumulator 5. The second accumulator 5, which is also a digital integrator, furnishes a value Z between 1 and 15 to the first accumulator 3 in the present embodiment. The value Z determines the integration time constant of the first accumulator 3.

Figure 2:
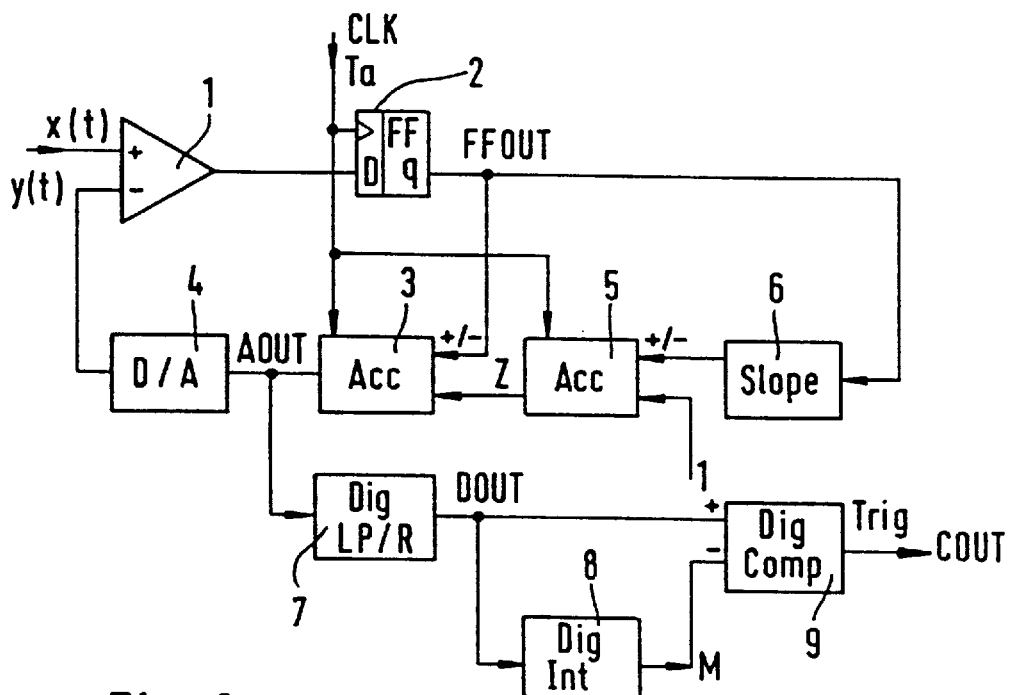
FIG. 2 is a block diagram of another embodiment of the present invention.

The embodiment of the present invention of FIG. 2 differs from the circuit of FIG. 1 by the further processing of the digital output signal after having passed the digital low-pass filter 7. The filtered output signal DOUT is converted into a square wave signal COUT (which represents the input signal x(t) in a conditioned form) by way of a digital threshold value comparator 9 and a mean value generator which is a digital integrator 8. The frequency of the square wave signal, apart from phase shifts which are mainly due to the time constants of the digital filters, corresponds to the frequency of the analog input signal x(t).

Figure 3:
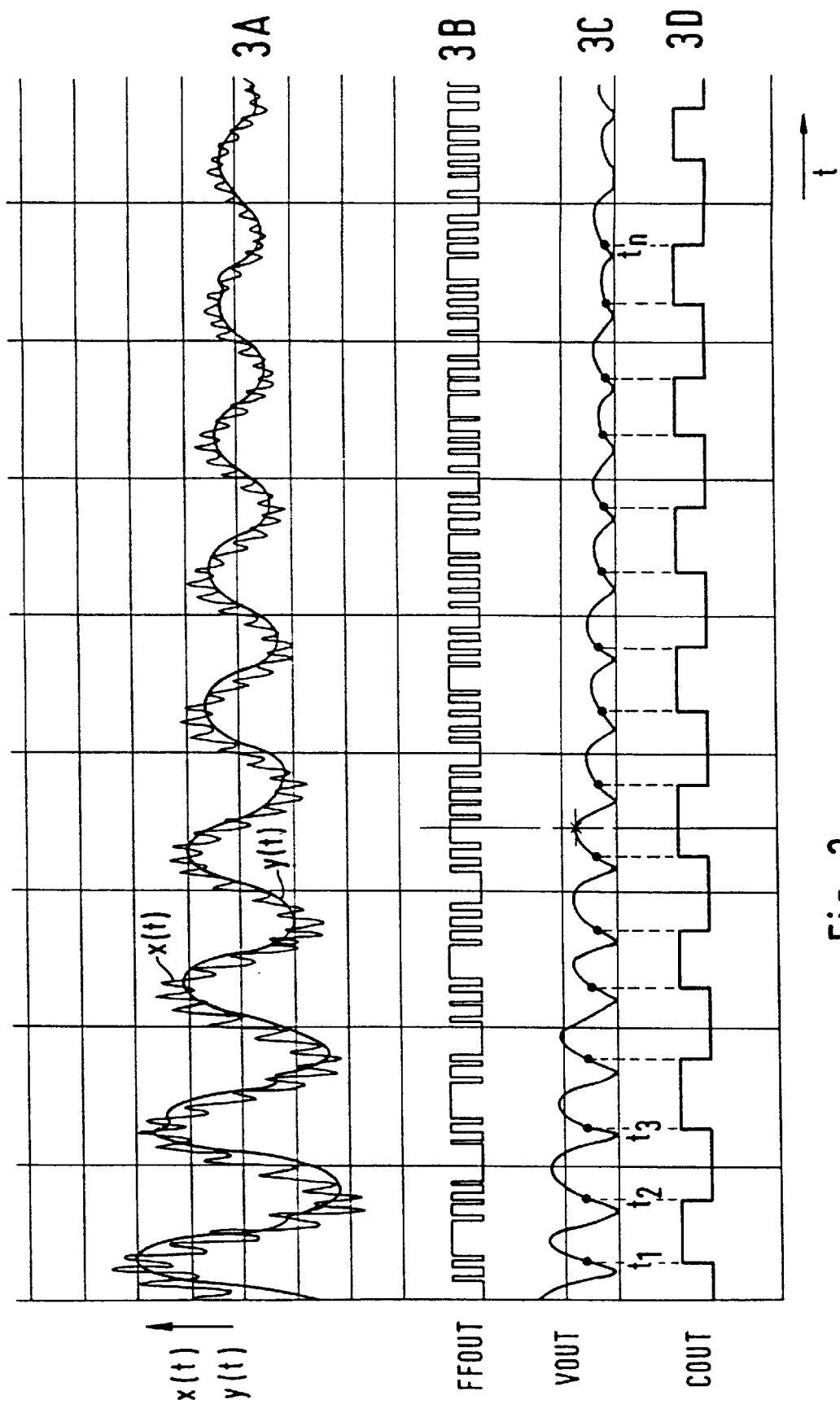
FIG. 3 shows timing diagrams of signals to illustrate the operation of the circuits of FIG. 1 and FIG. 2.

The timing diagrams of FIG. 3 show the operation of the circuits of FIGS. 1 and 2. Curve 3A indicates the analog input signal x(t) affected by noise and high frequency interferences and indicates the adapted signal y(t) prevailing at the output of the digital-to-analog converter 4. The signal y(t) is shown in curve 3A by the stepped curve originating from the working cycle CLK. The number of high frequency interferences is greatly reduced in y(t) in comparison with signal x(t).

Curve 3B shows the output signal FFOUT of the clock-controlled flip-flop 2. The number of successive binary output signals of equal value or, as seen in curve 3B, the duration of the uniform binary signals, includes information about the edge steepness of the analog input signal.

Curves 3C and 3D in FIG. 3 relate to the circuit of FIG. 2. Curve 3C is the analog reproduction VOUT of the digital, rectified output signal DOUT which is the output of the digital low-pass filter 7. The mean value M of curve 3C is produced by the integrator 8. The mean values are indicated by points on curve 3C, and attaining the mean values causes change-over of the square wave output signal. The mean value serves as a threshold for the threshold value comparator 9. The quantity of the digital output value DOUT reaches the mean value M determined by the integrator 8 at times $t_1$, $t_2 \ldots t_n$. The threshold comparator is "set" or "reset" at times $t_1, t_2 \ldots t_n$, as shown in curve 3D. Curve 3C in conjunction with curve 3D illustrates the adaption of the hysteresis to the analog input signal x(t) achieved by the present invention.

As already explained, the mean value M is evaluated as a threshold value for the threshold value comparator 9 and, consequently, determines the hysteresis of the trigger circuit according to the present invention and the course of the square wave signal at the output of the circuit of FIG. 2.

We claim:

1. Circuit for conditioning and digitizing an analog input signal, including a trigger circuit which processes the analog input signal by way of a variable hysteresis which adapts to the signal to be conditioned, characterized in that a control circuit is provided as a delta modulator and has a comparator which compares the analog input signal to be conditioned, which is the reference input of the control circuit, with an adapted signal, produces a binary signal representative of the signal variation and conducts it to a clock-controlled bistable flip-flop, the output signal of the bistable flip-flop is a binary data stream representative of the difference between the analog input signal to be conditioned and the adapted signal, in that a first digital accumulator is provided to integrate the data stream and to conduct it, by way of a digital-to-analog converter, as an adapted signal to the second input of the comparator, and in that the integration time constant or the numerical value that is respectively added in the accumulator in the integration cycle is variable as a function of the output signal of the flip-flop, and the digital output signal of the first accumulator is the conditioned and digitized signal corresponding to the analog input signal.

2. Circuit as claimed in claim 1, characterized in that the digital output signal of the first accumulator is processed further by way of a digital low-pass filter.

3. Circuit as claimed in claim 2, characterized in that an edge detector determines the number of the successive binary output signals of the flip-flop of identical value, and in that a second accumulator connected downstream of the edge detector generates a numerical value for adapting the integration constant of the first accumulator.

4. Circuit as claimed in claim 3, characterized in that the first accumulator in each case adds or subtracts a value between 1 and 15, determined by the second accumulator, as a function of the number of the successive binary output signals of the flip-flop of identical value (and thus as a function of the edge steepness of the analog signal).

5. Circuit as claimed in claim 4 characterized in that the digital output signal of the first accumulator can be processed further by way of a digital threshold value comparator which compares the digital output signal, in consideration of the sign, with the mean value of the quantity of the digital output signal and evaluates it to generate a conditioned square wave signal which corresponds to the analog input signal.

6. Circuit as claimed in claim 5, characterized in that the mean value of the quantity of the digital output signal is evaluated as a threshold value of the threshold value comparator, and the threshold value comparator is "set" when the quantity of the digital output signal is in excess of the mean value and positive, and the comparator is "reset" when the quantity is in excess of the mean value but negative.

7. Circuit as claimed in claim 6, characterized in that the mean value, which serves as a threshold value of the threshold value comparator, is produced by way of a digital integrator.

8. Circuit as claimed in claim 7, characterized in that the digital output signal of the first accumulator is fed to the threshold value comparator and the digital integrator by way of a digital low-pass filter.

9. A circuit for conditioning and digitizing an analog input signal comprising:
   a comparator for:
      (a) comparing an analog input signal with an adapted signal, and
      (b) developing a binary signal representative of a difference between the analog input signal and the adapted signal;
   a clock-controlled bistable flip-flop for converting the binary signal into a binary data stream representative of the difference between the analog input signal and the adapted signal;
   a digital accumulator for:
      (a) integrating the binary data stream by an integration time constant which is variable as a function of the binary data stream, and
      (b) developing a digital output signal which is a conditioned and digitized signal corresponding to the analog input signal; and
   a digital-to-analog converter for:
      (a) converting the digital output signal to an analog signal, and
      (b) conducting the analog signal to said comparator as the adapted signal.

10. A circuit according to claim 9, further including a digital low pass filter for processing the digital output signal of said digital accumulator.

11. A circuit according to claim 9, wherein the integration constant of said digital accumulator is developed by a circuit comprising:
   (a) an edge detector for determining the number of successive identical binary signals of the binary data stream, and
   (b) a second accumulator connected downstream of and responsive to said edge detector for developing the integration constant of said digital accumulator.

12. A circuit according to claim 11, wherein the integration time constant is in a range between 1 and 15 dependent upon the number of successive identical binary signals of the binary data stream.

13. A circuit according to claim 12 further including:
   (a) means for developing a mean value of the digital output signal, and
   (b) a digital threshold value comparator for:
      (1) comparing the digital output signal with the mean value of the digital output signal, and
      (2) generating a conditioned square wave signal corresponding to the analog input signal.

14. A circuit according to claim 13, wherein said digital threshold value comparator is:
   (a) "set" when the digital output signal is positive and in excess of the mean value of the digital output signal, and
   (b) "reset" when the digital output signal is negative and in excess of the mean value of the digital output signal.

15. A circuit according to claim 14, wherein said means for developing the mean value of the digital output signal includes a digital integrator.

16. A circuit according to claim 15, wherein said digital low pass filter is:
   (a) between said digital accumulator and said threshold value comparator, and
   (b) between said digital accumulator and said digital integrator.

* * * * *